United States Patent [19]

Etienne et al.

[11] Patent Number: 5,474,833
[45] Date of Patent: Dec. 12, 1995

[54] MAGNETORESISTIVE TRANSDUCER AND METHOD OF MANUFACTURE

[75] Inventors: Patrick Etienne, Igny; Alain Schuhl, Clamart, both of France

[73] Assignee: Thomson-CSF, Paris, France

[21] Appl. No.: 206,143

[22] Filed: Mar. 7, 1994

[30] Foreign Application Priority Data

Mar. 19, 1993 [FR] France ................... 93 03206

[51] Int. Cl.⁶ .................................. B32B 9/00
[52] U.S. Cl. .................. 428/209; 360/113; 338/32 R; 324/252; 428/688; 428/900; 428/210
[58] Field of Search .................. 428/209, 901, 428/688, 210, 900; 360/113, 111; 324/207.21, 252; 338/32 R

[56] References Cited

U.S. PATENT DOCUMENTS

| | | | |
|---|---|---|---|
| 4,609,950 | 9/1986 | Chiba | 360/111 |
| 4,800,457 | 1/1989 | Kryder | 360/113 |
| 5,159,513 | 10/1992 | Dieny | 324/252 |
| 5,287,238 | 2/1994 | Baumgart | 324/207.21 |
| 5,301,079 | 4/1994 | Cain | 360/113 |
| 5,313,186 | 5/1994 | Schuhl | 324/252 |
| 5,373,238 | 12/1994 | McGuire | 338/22 R |

FOREIGN PATENT DOCUMENTS

| | | |
|---|---|---|
| 0152000 | 8/1985 | European Pat. Off. . |
| 0221540 | 5/1987 | European Pat. Off. . |
| 0406060 | 1/1991 | European Pat. Off. . |

*Primary Examiner*—Patrick J. Ryan
*Assistant Examiner*—Patrick R. Jewik
*Attorney, Agent, or Firm*—Oblon, Spivak, McClelland, Maier & Neustadt

[57] ABSTRACT

A magnetoresistive detector comprising a stack of layers having different magnetic characteristics (magnetic metal multilayers) wherein there is provision, under the effect of an electrical field, for a transfer of electrons perpendicularly to the layers. To ensure several perpendicular transfers through the same stack of layers, this stack is enclosed between two electrodes, and the electrical conduction of the entire piece is interrupted by a cutting out of the structure in the form of teeth in a Greek key pattern.

15 Claims, 6 Drawing Sheets

MAGNETORESISTIVE TRANSDUCER AND METHOD OF MANUFACTURE

BACKGROUND OF THE INVENTION

The invention relates to a magnetoresistive transducer and to a method for the manufacture of such a transducer.

The transfer of electrons in Magnetic Metal Multilayers has been studied for the past few years because it enables the study of the magnetoresistance of a material considered. This phenomenon originates in the difference in resistivity of the material, under an external magnetic field, or in the absence of this field, related to the variation of the properties of the interfaces.

In FIG. 1a, a type A material for example is magnetic while a type B material is non-magnetic.

For practical reasons, the measurements are generally made only by applying an electrical field in parallel to the planes of the layers. In this case, if the diffusion length (5 to 100 nm) is greater than the thickness of the layers (1 to 5 nm), the path taken by an electron before it meets an interface may be great. The approach wherein an electrical field is applied perpendicularly to the planes of the layers (FIG. 1b) would therefore be far more favorable for the use of magnetoresistance with higher efficiency since, in this case, the electrons would swiftly encounter an interface. This idea has therefore been circulating for some years, but it is very difficult to achieve technically, and the object of the invention lies in an approach that circumvents these difficulties.

Practical embodiments that work by the measurement of the current perpendicularly to the plane of the layers may take the form shown in FIG. 1c.

It can then be noted that:

1°/ Since the resistivity of the materials is low (about $10^{-5}$ $\Omega$.cm), the values of resistance to be measured are very low.

For example:

$$R = 10^{-5} \times \frac{5 \times 10^{-5}}{(\pi/4)10^{-8}} = 6{,}36 \times 10^{-2} \Omega$$

2°/ The contact resistance $R_c$ is in a high proportion for the contact surface area is small (some $\mu m^2$).

3°/ The technology is little-known and difficult.

4°/ The currents to be measured are low for it is not possible to let through a great deal of current (in comparison with electron transfer parallel to the layers).

5°/ It is difficult, with conventionally envisaged approaches, to place an object having a magnetic information element close to the detection device (the making of contacts means that the medium containing the information cannot be placed in the vicinity).

Because of these reasons, no coherent studies under ambient temperature have been made to date, and measurements have been made only at low temperatures by using superconductive connections which, of course, limit the observations solely to the field of low temperatures. Hence, at present, there are no plans to make sensors that have the advantage of perpendicular electron transfer and work at ambient temperature.

SUMMARY OF THE INVENTION

The invention therefore relates to a method wherein the interruption or break is got by etching.

The invention also relates to a magnetoresistive transducer comprising at least one layer of a composite material comprising at least two types of particles having different magnetic characteristics, wherein said transducer also comprises:

two layers of conductive material enclosing the layer of composite material;

at least two electrodes located on at least one of the layers of conductive materials in zones that are distant from each other along the plane of the layers; the layer of composite material and a layer of conductive material that bears an electrode comprising at least one interruption of electrical conduction located between the zones comprising the electrodes.

By application of the foregoing, the magnetoresistive transducer has several even-order and odd-order interruptions, the even-order interruptions interrupting the electrical conduction of one of the layers of conductive material while the odd-order interruptions interrupt the electrical conduction of the other layer of conductive material.

Finally, the invention relates to a method for the manufacture of a magnetoresistive transistor comprising the following steps:

a) the making of a stack of at least the following layers:
   a first layer of conductive material;
   at least one layer of composite material comprising particles of magnetic material and particles of non-magnetic material;
   a second layer of conductive material.

b) the making of at least one interruption of electrical conduction in one of the layers of conductive material and in the layer of composite material.

BRIEF DESCRIPTION OF THE DRAWINGS

The different objects and features of the invention will appear more clearly from the following description, made on a non-restrictive basis, and from the appended figures of which.

MORE DETAILED DESCRIPTION

Figure 1A:
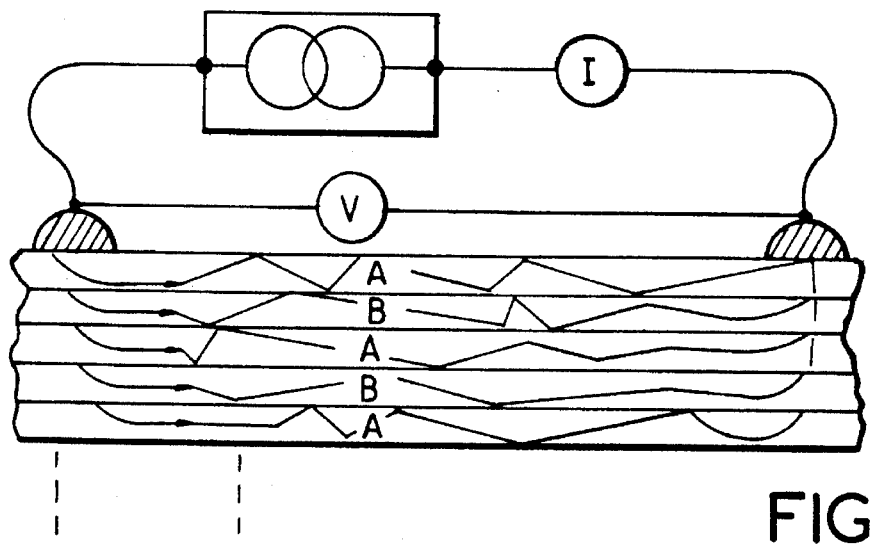
FIGS. 1a to 1c show devices known in the prior art.
Figure 1B:
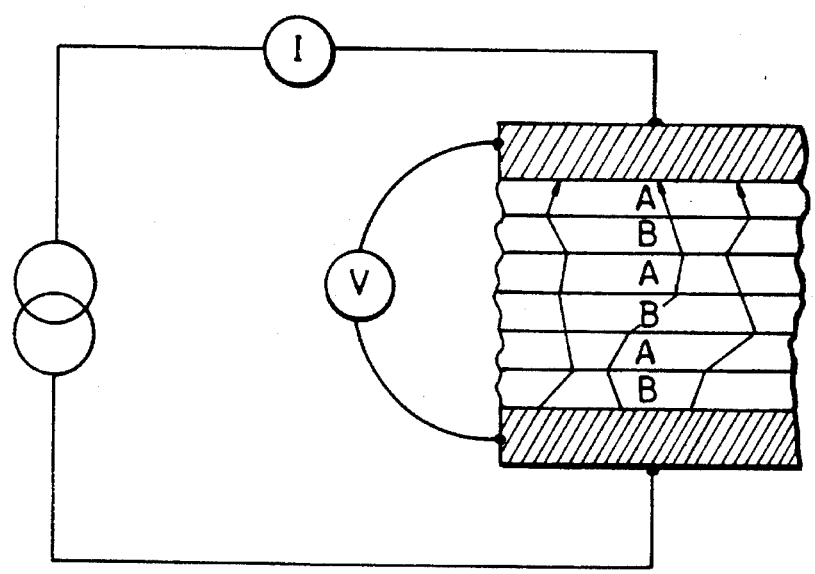
Figure 1C:
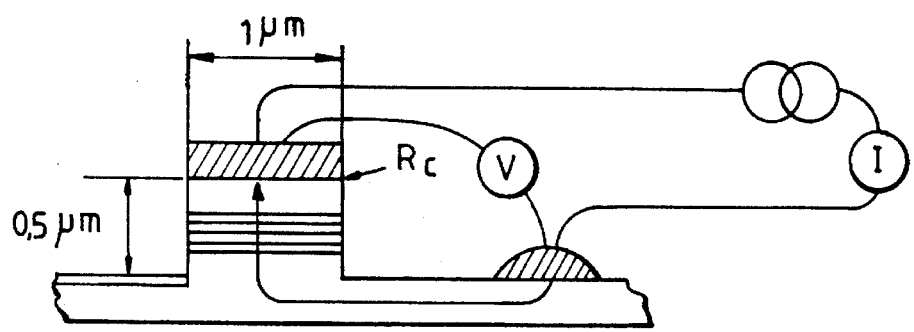
Figure 2A:
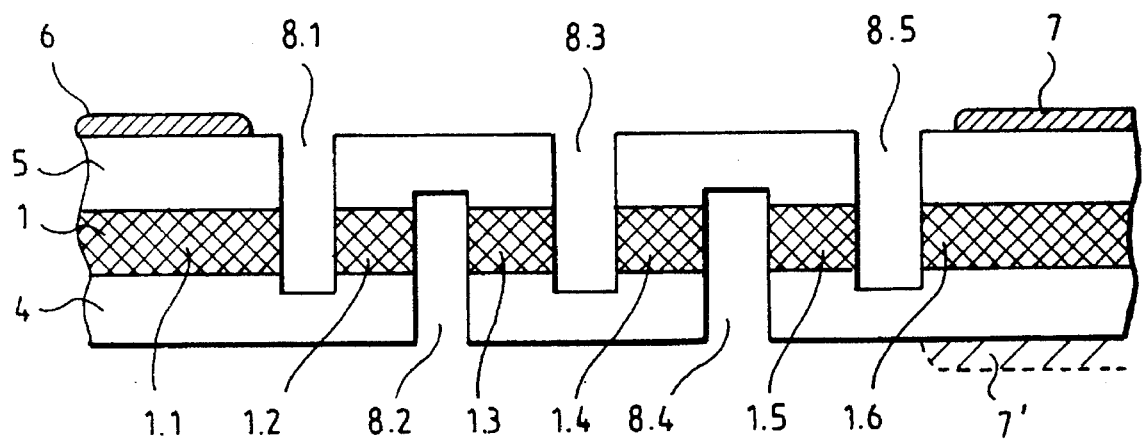
FIGS. 2a, 2b, 2c show exemplary embodiments of the device of the invention.

Referring to FIG. 2a, a description shall now be given of a basic device according to the invention.

This device has a layer 1 of a composite material constituted by particles of magnetic material and particles of insulating or semiconductor material. This layer is enclosed between two layers 4 and 5 made of conductive materials. One of the conductive layers, 5 for example, has two electrodes 6 and 7 located at two opposite ends of the layer 5. The electrodes could also be positioned so that one is on the layer 5 and the other is on the layer 4. For example, the electrode 7 could be at the location referenced 7' in FIG. 2a.

The stack of layers comprises at least one interruption of electrical conduction. This interruption affects the layer 1 and at least one conductive layer 4 and 5.

In a preferred practical embodiment, several interruptions are planned. Odd-order interruptions 8.1, 8.3, 8.5 are made in the conductive layer 5 and in the layer 1. Even-order interruptions 8.2, 8.4 are made in the conductive layer 4 and in the layer 1. Thus, a current that has to flow between the electrodes 6 and 7 must pass through the different elements 1.1 to 1.6.

Functionally, the structure of FIG. 2*a* therefore works as if the different elements 1.1 to 1.6 had been stacked. Furthermore, the surface area of the electrodes 6 and 7 may be very great, and hence its resistance may be low as compared with that of the elements 1.2 to 1.5.

Figure 2B:
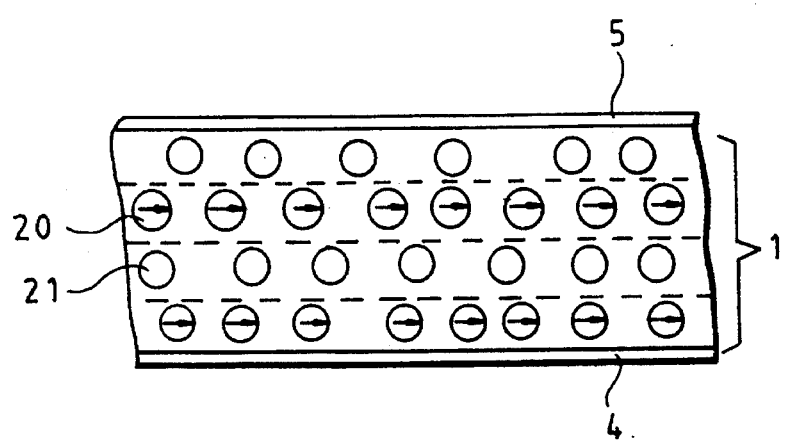

This invention can also be applied to granular material. It can also be planned to arrange the particles in the layer 1 according to a determined distribution. Notably, according to FIG. 2*b*, there is provision for alternating layers of different types of particles.

For example, by providing for particles 20 whose magnetization is fixed and insensitive to the field to be detected and particles 21 whose magnetization is sensitive to the field to be detected, there are different layers, some of which have particles 20 while others have particles 21. By providing for sufficiently thin layers, it is possible to obtain a device wherein, in the direction perpendicular to the planes of the layers, a particle 21 has particles 20 as its first neighboring particles and vice versa. In this way, the tunnel junctions between particles of a same type do not percolate through the material.

Figure 2C:
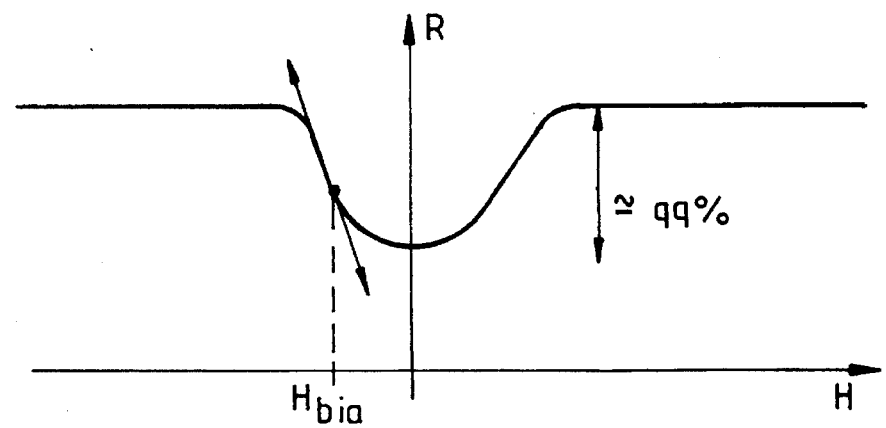

The variation in resistivity as a function of the magnetic field follows the law of variation shown in FIG. 2*c*. There is provision therefore for making it possible to function in a zone of linear variation giving high sensitivity of detection. To this end, a continuous magnetic field, for example $H_{bias}$, is applied, thus enabling operation in a linear zone of the curve.

Figure 3:
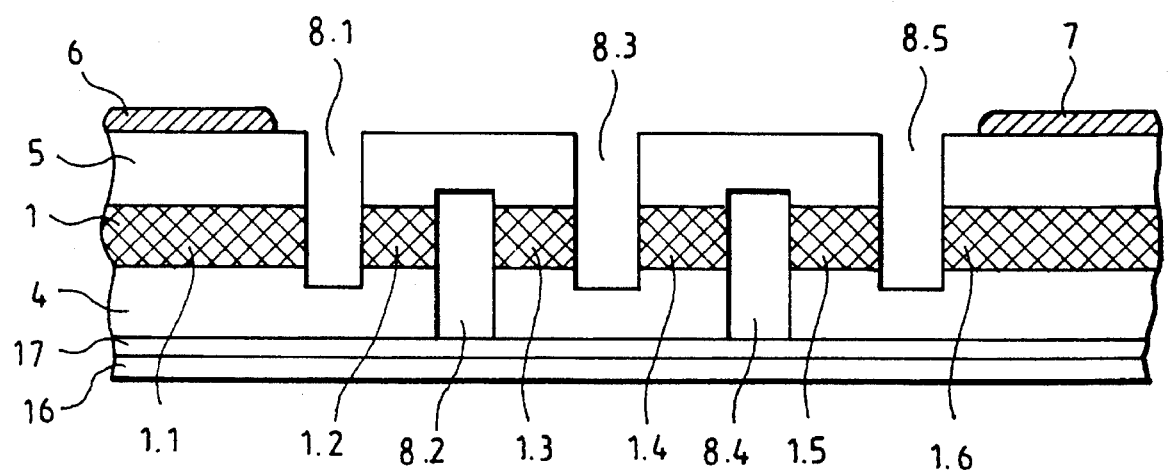
FIG. 3 shows an alternative embodiment of the device of the invention.

The means that can be used to apply this continuous magnetic field could be a permanent magnet such as a layer of a magnetized material 16 shown in FIG. 3. This layer 16 may be a thin or thick layer, depending on the intensity of induced magnetization and depending on the thickness of the layer 1. It may be insulated from the layer 4 by an insulation layer 17.

It is also possible to provide for a electrically conductive loop that makes it possible to induce a magnetic field in the layer 1. This conductive layer (not shown) then takes the place of the layer 16.

Referring to FIGS. 4*a* to 4*d*, we shall now describe a method of manufacture according to the invention.

A stack of the following layers is made on a substrate 10 of insulating material:

a layer 4 of a conductive material;

a layer 1 of a composite material as described here above made for example in the form of a stack of sublayers having different magnetic characteristics;

a layer 5 of a conductive material.

Figure 4A:
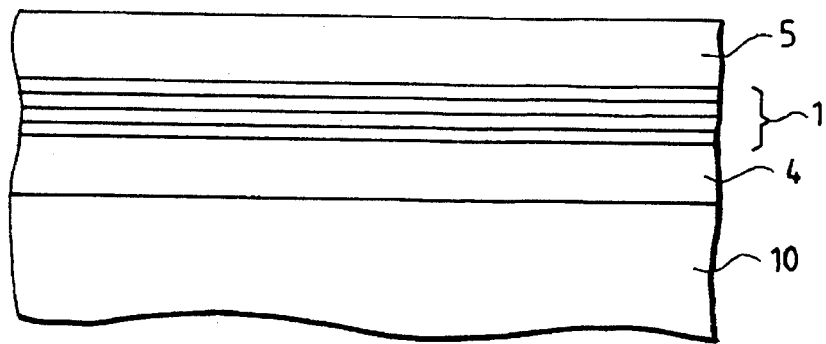
FIGS. 4a to 4d show a method of making the device of the invention.
Figure 4B:
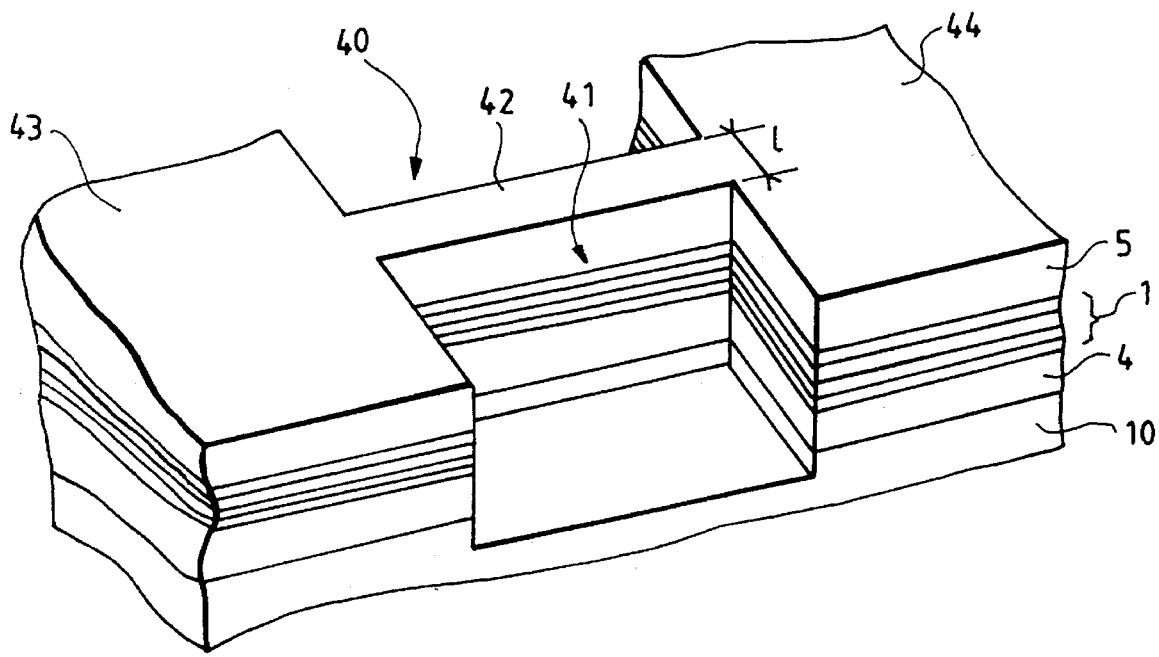

We thus have the stack of layers of FIG. 4*a*.

The approach proposed is shown schematically in FIG. 4*a*. It is made out of a multilayer of material A and B interposed between two layers of a material C which is a good conductor (this multilayer shall hereinafter be called a "metal deposit").

Two rectangular cuts 40 and 41 are then hollowed out (FIG. 4*b*) at least up to the substrate 10 in such a way as to leave only a thin strip (for example l=1 μm). The current incoming zones 43, 44 located on either side of the strip are constituted by a metal deposit and will have a big size in order to show low resistance $R_a$. At these incoming zones, it is possible to deposit the large-sized electrodes 6, 7 and hence to have resistance values $R_c$ of the contacts that are small too.

Then patterns 8.1, 8.2, . . . , 8.4 are hollowed out laterally, forcing the current to flow perpendicularly to the layers to be analyzed. In the example shown in FIG. 4*c*, a focused ion beam can be used to hollow out the strip so as to obtain a toothed or "Greek key" pattern. The spacing between the apertures may be reduced to distances of less than 1 μm.

Figure 4C:
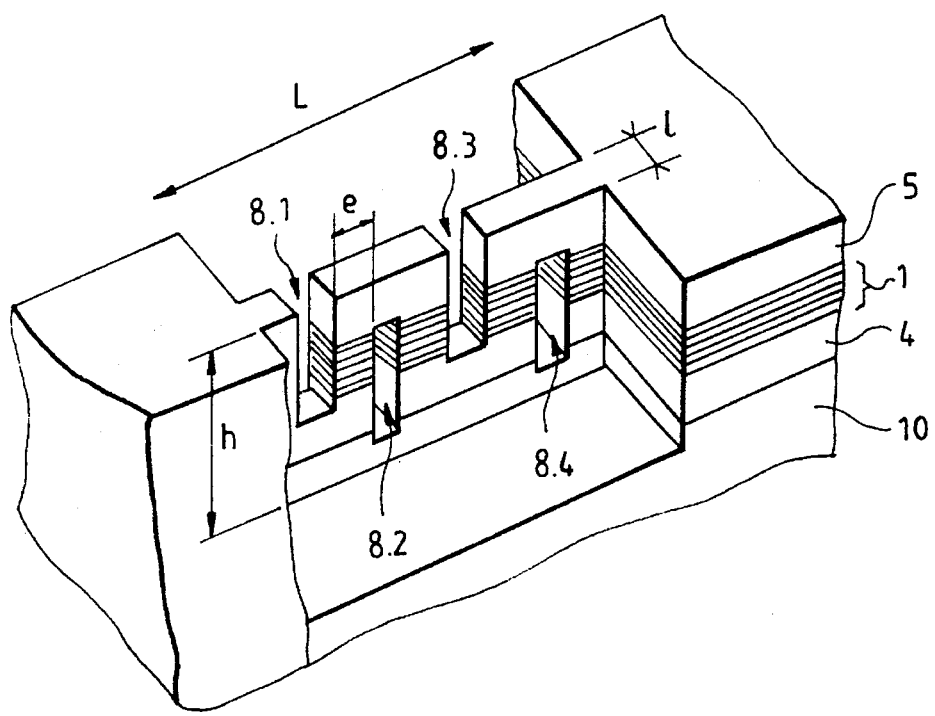

For example, the structure of FIG. 4*c* may have the following dimensions:

thickness l of the strip: about 1 μm;

height h of the strip: about 2.5 μm;

length L of the strip (according to the number of apertures made): about 10 μm.

Figure 4D:
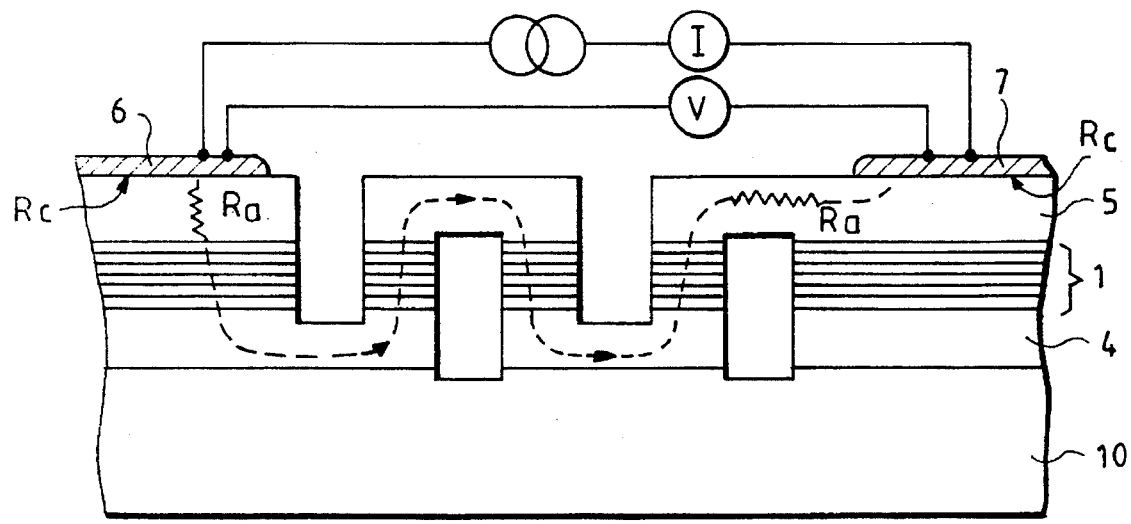

FIG. 4*d* then shows the path travelled by the current. The metallic multilayer is crossed, in this example, four times by a current perpendicular to the plane of the deposit but it is clear that the number of crossings can be increased as many times as desired. The section in which the current flows has small dimensions (hence high resistance), i.e. in this case a strip width of 1 μm for a spacing of 1 μm.

Figure 5A:
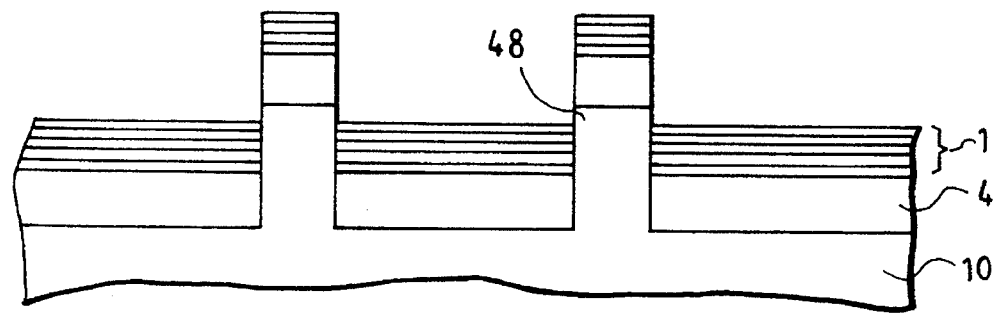
FIGS. 5a to 5c show another method of making the device of the invention.
Figure 5B:
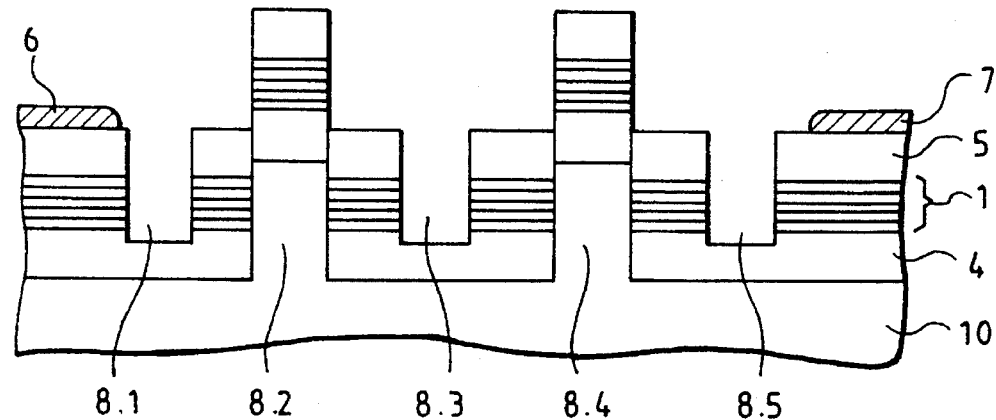
Figure 5C:
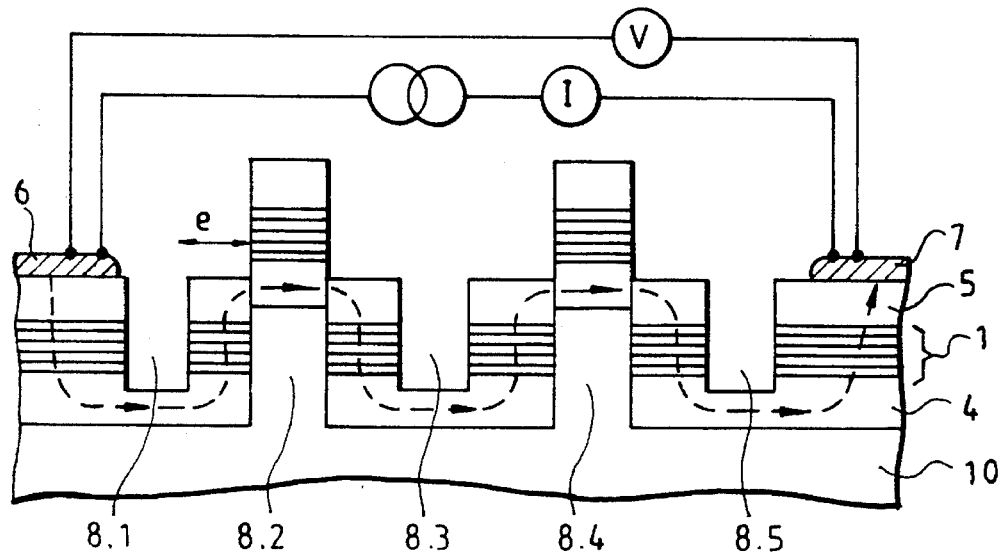

Another exemplary method consists in carrying out the operations shown schematically in FIGS. 5*a* to 5*c*.

On a substrate 10 that is etched (chemically or by ion erosion) and has thin (about one-μm) tooth-like projections (hereinafter called teeth), there are deposited the first layer 4 of conductive material and then the layer 1 of composite material. The structure of FIG. 5*a* is obtained. Then the second layer of conductive material 5 is deposited (FIG. 5*b*).

The height h of the tooth is designed to be greater than the thickness of the first layer of 3 conductive material 4 plus the thickness of the layer 1 but is smaller than the total height of the deposit (first layer 4, layer 1, second layer 5). There are electrical connections between the first conductive layer 4 located on the tooth 48 and the second conductive layers 5 located on either side of the tooth 48. This ensures the electrical continuity above the tooth.

It is then enough, for example by classic techniques of lithography (or other means), to hollow out grooves 8.1, 8.3 as shown in FIG. 5*c* to obtain a path of the current perpendicular to the layers 1 of composite material as shown in FIG. 5*c*. This makes it possible to exploit the phenomenon with the methods described here above.

The device thus described can be made, for example, with the following materials and thicknesses:

layers made of conductive materials 4, 5: amagnetic metal such as silver with a thickness of 1.5 μm;

layer of composite material 1: multilayers of silver and cobalt where the silver layers can have a thickness of 8 nm and the cobalt layers a thickness of 2 nm. It possible to provide for about forty layers of silver alternating with about forty layers of cobalt.

The device thus designed makes it possible to minimize the contact resistance values $R_c$ of the electrodes and the access resistance values $R_a$ between the electrodes and sensitive zones of the device in relation to the total resistance of the device. Indeed, the width e of each element of the device may be of the order of one micrometer and several elements are series-connected, which considerably increases the resistance of the device with respect to the resistance values $R_c$ and $R_a$.

Here above, it has been considered that the layer of composite material 1 is constituted by two materials (two types of particles), but it is clear that it is possible to provide for a composite material constituted by more than two types of materials.

Similarly, a structure with a Greek key pattern (FIGS. 4d, 5c) has been designed. However, it is possible to design any other shape that would enable a transfer of electrons perpendicularly to the layers of composite material.

In a magnetic sensor application, the invention has the advantage of making it possible to place the transducer in the vicinity of a medium of magnetic information elements to be read. For example, it is possible to position a magnetic tape in the vicinity of the transducer without being hampered by the electrodes.

What is claimed is:

1. A magnetoresistive transducer comprising at least one layer of a composite material comprising at least two different particles having different magnetic characteristics, wherein said transducer also comprises;

two layers of conductive material enclosing the layer of composite material;

at least two electrodes located on at least one of the layers of conductive materials in zones that are distant from each other along the plan of the layers; the layer of composite material and said at least one layer of conductive material that bears an electrode comprising at least one interruption of electrical conduction located between the zones comprising the electrodes.

2. A transducer according to claim 1, wherein the layer of composite material comprises at least particles of magnetic material and particles of non-magnetic material.

3. A transducer according to claim 1, wherein said at least one interruption comprises several even-order and odd-order interruptions, the even-order interruptions interrupting the electrical conduction of one of the layers of conductive material while the odd-order interruptions interrupt the electrical conduction of the other layer of conductive material.

4. A transducer according to claim 2, wherein said at least two electrodes are located on one of said two layers of conductive material.

5. A transducer according to claim 2, wherein each interruption has an insulator material.

6. A transducer according to claim 2, wherein the particles of magnetic material are superparamagnetic.

7. A transducer according to claim 2, wherein the particles of magnetic material have a very weak coercive field.

8. A transducer according to claim 2, further comprising means to apply a permanent biasing magnetic field.

9. A transducer according to claim 8, wherein said means is a permanent magnet.

10. A transducer according to claim 9, wherein the permanent magnet is constituted by a thin layer of a magnetic material.

11. A transducer according to claim 9, wherein the permanent magnet has a conductive loop crossed by a direct current.

12. A transducer according to claim 2, wherein the particles are all made of the same material.

13. A transducer according to claim 2, wherein said at least two particles include:

first particles made of a material insensitive to a magnetic field to be detected;

second particles made of a material sensitive to said field to be detected.

14. A transducer according to claim 13, wherein the particles are distributed so as to have alternating layers of particles of the first particles and of the second particles parallel to the plane of the layers of conductive material.

15. A transducer according to claim 14, wherein the first particles have their permanent magnetization directed in parallel to a defined direction.

* * * * *